United States Patent [19]

Kunz

[11] Patent Number: 4,803,124
[45] Date of Patent: Feb. 7, 1989

[54] BONDING SEMICONDUCTOR CHIPS TO A MOUNTING SURFACE UTILIZING ADHESIVE APPLIED IN STARFISH PATTERNS

[75] Inventor: Rene Kunz, Mountain View, Calif.

[73] Assignee: Alphasem Corporation, Sunnyvale, Calif.

[21] Appl. No.: 85,355

[22] Filed: Aug. 14, 1987

Related U.S. Application Data

[63] Continuation of Ser. No. 2,267, Jan. 12, 1987, abandoned.

[51] Int. Cl.$^4$ .................. B05D 1/14; B32B 31/00; B05C 3/02
[52] U.S. Cl. ..................................... 428/200; 29/832; 29/840; 118/411; 156/295; 156/299; 156/578; 228/33; 239/601; 427/96
[58] Field of Search .......... 156/241, 295, 299, 308.2, 156/356, 578, 356, 578; 118/410, 411; 239/103, 87, 86; 222/606; 425/224–227, 461; 29/157 C, 840, 832; 228/179, 180.1, 180.2, 33, 56.3, 123, 248; 427/96, 282; 428/200, 198; 437/209; 357/66, 81

[56] References Cited

U.S. PATENT DOCUMENTS

| | | | |
|---|---|---|---|
| 2,264,632 | 12/1941 | Gerlitzi | 91/43 |
| 2,533,704 | 12/1950 | Zanetti | 91/12 |
| 2,575,976 | 11/1951 | Rock | 136/135 |
| 3,963,551 | 6/1976 | Marlinski | 156/299 |
| 4,239,576 | 12/1980 | Taki et al. | 156/297 |
| 4,255,644 | 3/1981 | Delorme | 228/179 |
| 4,480,983 | 11/1984 | Adams et al. | |
| 4,515,297 | 5/1985 | Schoenthaler et al. | 228/180.2 |
| 4,545,840 | 10/1985 | Newman et al. | |
| 4,577,398 | 3/1986 | Sliwa et al. | |
| 4,709,849 | 12/1987 | Socolowski | 228/56.3 X |

Primary Examiner—Michael W. Ball
Assistant Examiner—David Herb
Attorney, Agent, or Firm—Flehr, Hohbach, Test, Albritton & Herbert

[57] ABSTRACT

A method of bonding semiconductor chips to a mounting surface and a nozzle for same includes the steps of applying a first deposit of a die attach adhesive material to the mounting surface in a manner wherein the first deposit has the general shape of a starfish. This starfish shape is characterized by a raised central portion disposed at the intersection of the radially inner ends of a plurality of centrally thickened arms. The next step is to apply the bonding surface of a semiconductor chip against the deposit to cause the deposit to spread therebeneath while removing air pockets and hence any voids within the die attach adhesive material. The volume of the deposit being proportional to the surface area of the bonding surface and the configuration of the first deposit being defined to cause uniform and symmetrical spreading of the first deposite across the bonding surface provides full coverage of the bonding surface with a uniformly thick layer of adhesive. A die attach dispensing tool or nozzle includes a bottom shape including recessed portions whereby when the bottom of the tool is disposed in confronting relation to a mounting surface a flow passage carrying die attach adhesive material can be employed to fill the recessed portions and thereby define a deposit of die attach material in the general shape of a starfish.

11 Claims, 3 Drawing Sheets

U.S. Patent  Feb. 7, 1989  Sheet 1 of 3  4,803,124
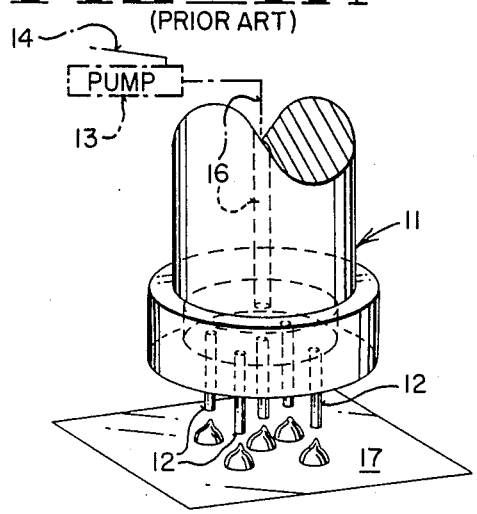
FIG_1A (PRIOR ART)
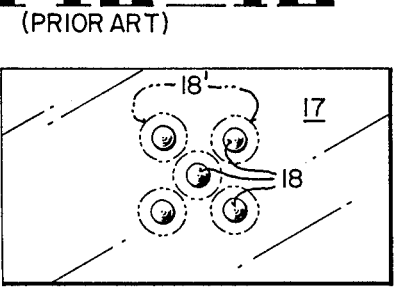
FIG_1B (PRIOR ART)
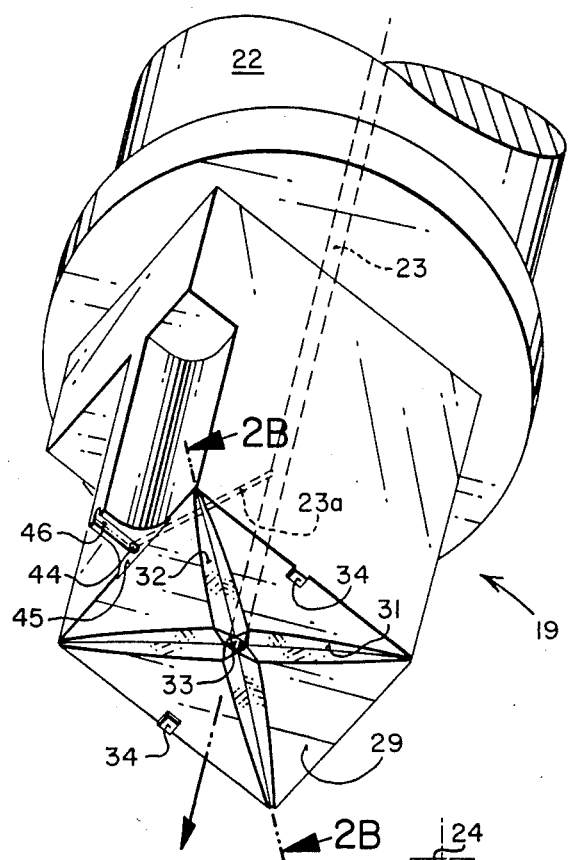
FIG_2
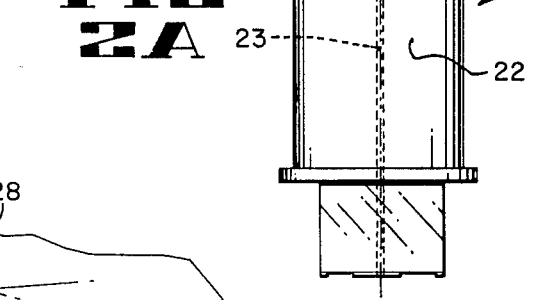
FIG_2A
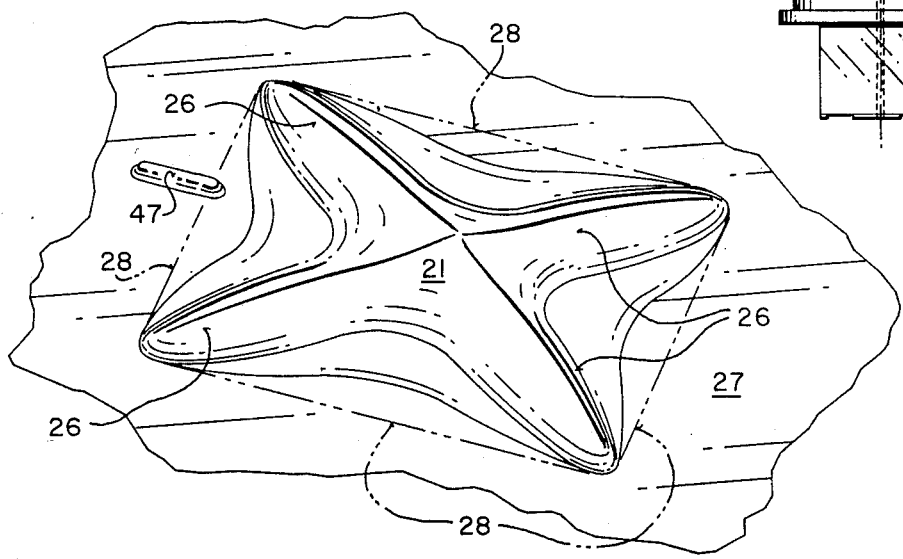
FIG_3

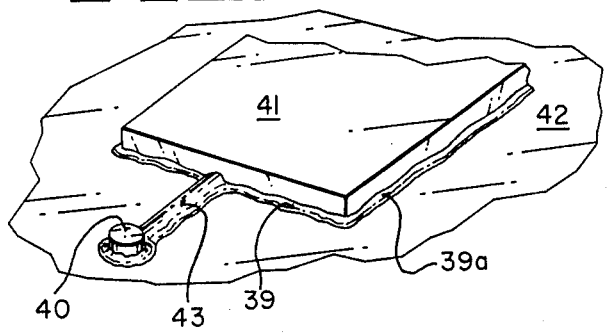
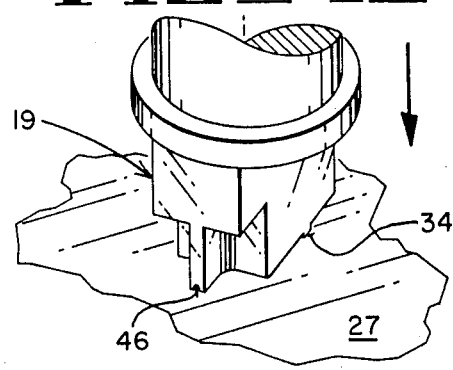
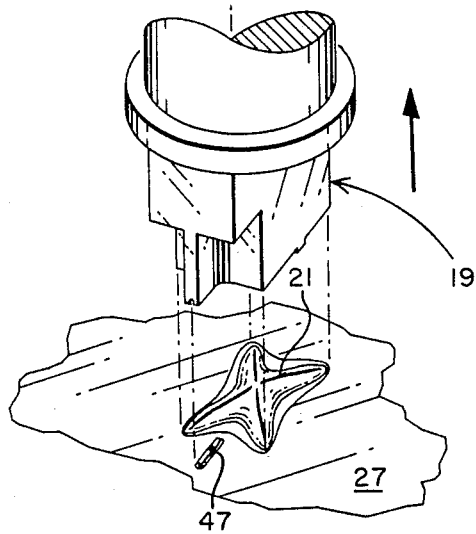
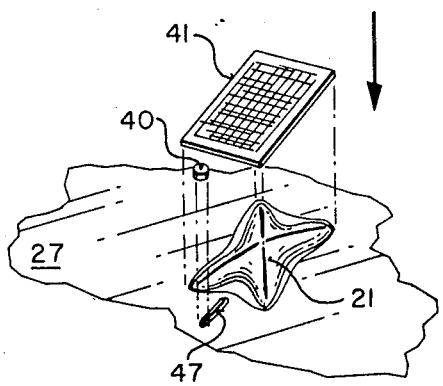
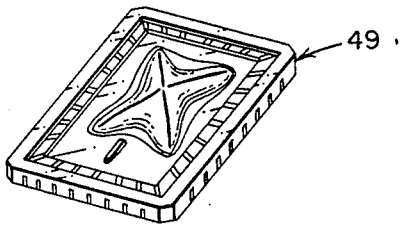
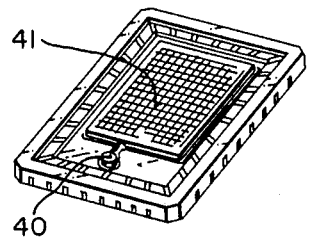
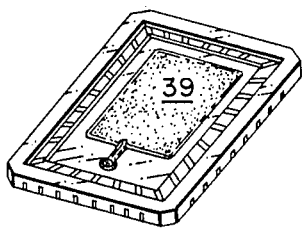

FIG_8
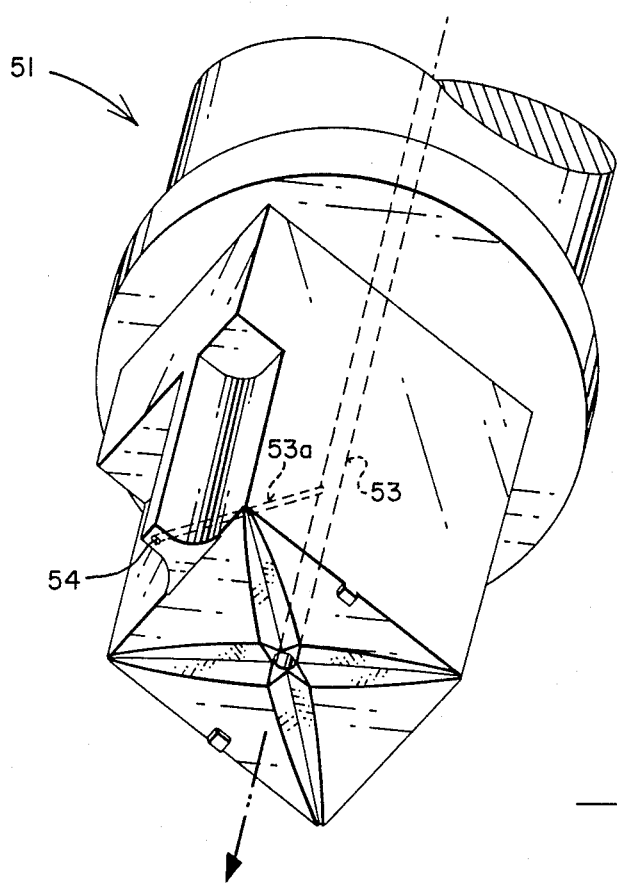
FIG_2B
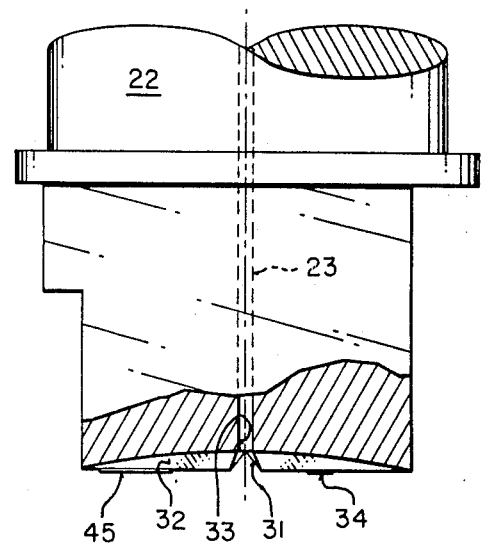
FIG_9
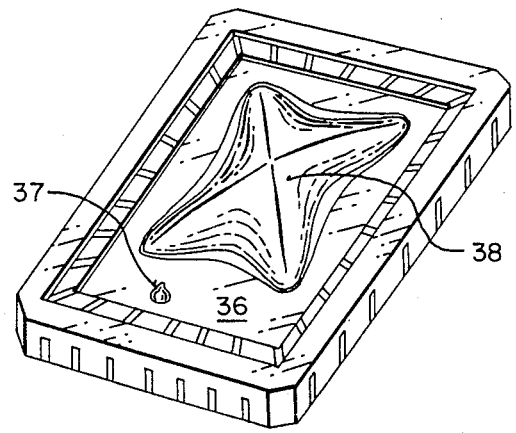
FIG_10
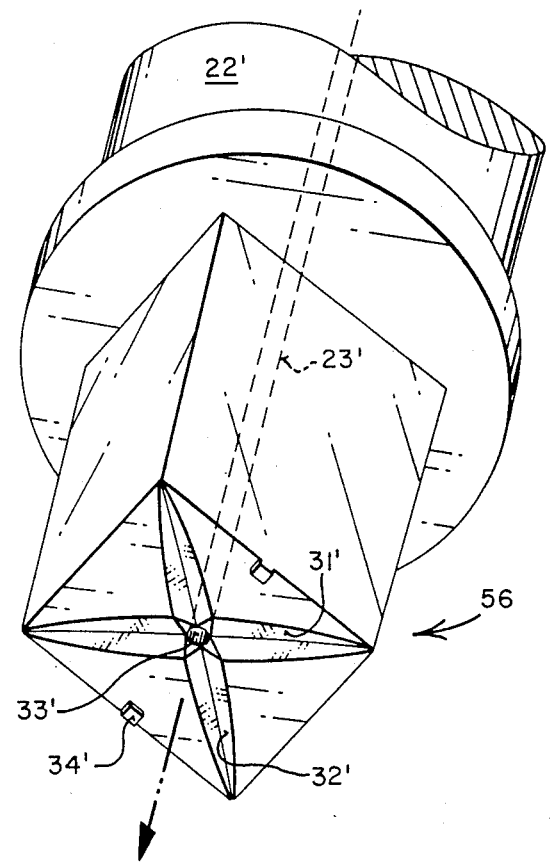

BONDING SEMICONDUCTOR CHIPS TO A MOUNTING SURFACE UTILIZING ADHESIVE APPLIED IN STARFISH PATTERNS

This is a continuation of application Ser. No. 2,267 filed Jan. 12, 1987 now abandoned.

This invention pertains to the bonding of semiconductor chips to a mounting surface by means of a conductive die attach adhesive material. In bonding semiconductor chips to a mounting surface, various techniques have previously been pursued. For example, as shown in FIGS. 1A and 1B, a group of five hypodermic needles coupled to a dispensing pump serve to dispense a number of spaced droplets of a die attach adhesive material onto a support surface for contact with the bonding surface of a semiconductor chip. However, when the chip is pressed against the droplet shown, each droplets expands as indicated in phantom lines in FIG. 1B so as to leave gaps between each adhesive drop.

However, it has been observed that an optimum bond should be substantially fully and uniformly spread between the chip and its mounting surface and be free of voids in the die attach adhesive material.

Accordingly, there has been a need for a method and means for bonding a chip employing a uniform and symmetrically distributed layer of die attach adhesive material free of voids therein.

SUMMARY OF THE INVENTION

In general, a method for bonding semiconductor chips as described herein includes steps of applying a deposit of a die attach adhesive material to a mounting surface in a manner wherein the deposit has the general shape of a starfish, the shape being characterized by a raised central portion disposed at the intersection of the radially inner ends of a plurality of arms thickened centrally thereof. Then, applying the bonding surface of a semiconductor chip against the deposit to cause the deposit to spread therebeneath across the bonding surface free of voids within the die attach adhesive. The volume of the deposit is proportional to the surface area of the bonding surface, and the configuration of the deposit is defined to cause uniform and symmetrical spreading of the deposit across the bonding surface of the chip to provide full coverage of the bonding surface of the chip, and with a uniformly thick layer of die attach adhesive material between the chip and the mounting surface.

A preferred tool for carrying out the foregoing method includes a nozzle for dispensing a deposit of die attach adhesive material onto a mounting surface for bonding a semiconductor chip to the surface includes an elongate rigid body having an elongate flow passage formed therethrough for dispensing die attach adhesive material from an end of the flow passage. A socket is formed at one end of the body communicating with the input end of the flow passage and is adapted to be tightly coupled to means for dispensing die attach adhesive material via the socket and flow passage onto the mounting surface. The underside or bottom end of the nozzle includes forming means in fluid communication with the discharge end of the flow passage. The forming means serves to form the deposit into the general shape of a starfish having a raised central portion disposed at the intersection of the radially inner ends of a plurality of arms increasingly thickened progressively radially inwardly thereof. The arms extend therefrom in a manner whereby when the planar bonding surface of a semiconductor chip is disposed in spaced parallel relation to the plane of the mounting surface, and as the bonding surface then moves in a direction normal to the plane of said mounting surface into contact with the deposit, the bonding surface serves to cause the deposit to spread symmetrically and with uniform thickness across the mounting surface in response to application of the planar bonding surface thereto when, the deposit has become substantially coextensive with the bonding surface of the chip.

In addition to the above, a nozzle has been arranged so as to simultaneously apply a small deposit of die attach adhesive material at a locus disposed laterally of the deposit applied in the form of a starfish whereby a grounding chip can be secured to the small deposit of die attach adhesive material.

In addition to the above and according to one embodiment of the invention, the simultaneous deposit of the small deposit of die attach material adjacent the larger deposit serves to form a conductive causeway electronically connecting a grounding chip with the bonding layer beneath the semiconductor chip.

OBJECTS

In general, it is an object of the present invention to provide an improved method and nozzle for bonding semiconductor chips to a mounting surface.

It is another object of the invention to provide an improved method and means for bonding a semiconductor chip to a mounting surface in a manner whereby the layer of bonding material constitutes a uniform and symmetrical layer of die attach adhesive material substantially free of voids therein.

It is another object of the present invention to provide an improved method for bonding semiconductor chips to a mounting surface in a manner whereby first and second deposit of die attach material can be applied simultaneously for attachment of a semiconductor integrated circuit chip while the second deposit is adapted for bonding a grounding chip to the mounting surface.

Yet another object of the invention is to provide a nozzle adapted for applying a novel deposit of adhesive to a mounting surface for carrying out the method of bonding semiconductor chips to a mounting surface wherein the underside of the nozzle is characterized by means for positively spacing a deposit forming configuration beneath the nozzle from the mounting surface in a manner minimizing "drawback" of die attach adhesive material upon removal of the tool or nozzle.

The foregoing and other objects of the invention will become more readily evident from the following detailed description of preferred embodiments when considered in conjunction with the drawings.

BRIEF DESCRIPTION OF THE DRAWINGS

FIG. 1A shows a diagrammatic perspective view of one means for applying die attach adhesive material to a mounting surface according to the prior art;

FIG. 1B shows a diagrammatic plan view of deposits applied by the mechanism shown in FIG. 1A and indicating the manner in which the deposits applied to the surface expand when a semiconductor chip is applied thereto;

FIG. 2 shows a diagrammatic perspective view taken from beneath showing the underside of a nozzle according to the invention;

FIG. 2A shows a diagrammatic elevation view of a nozzle according to the invention;

FIG. 2B shows a diagrammatic side elevation of a nozzle according to the invention partially broken away along line 2B—2B of FIG. 2;

FIG. 3 shows a diagrammatic perspective view of a deposit of die attach adhesive material applied to a mounting surface in conjunction with a conductive causeway to be employed in supporting a grounding chip (not shown);

FIG. 4A shows a diagrammatic perspective view of a semiconductor chip bonded to a mounting surface laterally adjacent a grounding chip mounted in a conductive causeway to be electrically connected with the conductive underside of the semiconductor chip;

FIGS. 4B–4D show successive steps in carrying out the method of Applicant's invention;

FIG. 5 shows a diagrammatic perspective view of a semiconductor "package" containing a non-conductive mounting surface and a deposit of die attach material together with a deposit of die attach material to form a conductive causeway between a grounding chip and the semiconductor bonding material. Both deposits shown in FIG. 5 are in pliant or fluid form, (i.e., prior to hardening);

FIG. 6 shows a diagrammatic perspective view of a semiconductor package containing a non-conductive mounting surface and a semiconductor integrated circuit chip applied to the deposit shown in FIG. 5 with a grounding chip applied to the causeway deposited in FIG. 5;

FIG. 7 shows a diagrammatic perspective view of a package disclosing the condition of the bonding layer after removal of the semiconductor chip and grounding chip;

FIG. 8 shows a diagrammatic perspective view as viewed from beneath of another embodiment of a nozzle similar to that of FIG. 2 but providing a grounding chip deposit which includes no causeway (as shown in FIG. 9);

FIG. 9 shows a diagrammatic perspective view of a semiconductor package containing a conductive mounting surface and a deposit for attaching a semiconductor integrated circuit as well as a small deposit disposed laterally thereof for attaching a grounding chip thereto;

FIG. 10 shows a diagrammatic perspective view taken from beneath showing the underside of the nozzle of another embodiment of the invention.

DETAILED DESCRIPTION OF PREFERRED EMBODIMENTS

As noted above, according to one prior art technique for applying a die attach adhesive to a mounting surface for purposes of attaching a semiconductor chip thereto, a dispensing head or nozzle 11 as shown in FIG. 1A carries a group of hypodermic syringes 12 depending downwardly from the underside of head 11. A positive displacement pump 13 supplied with die attach adhesive via an input line 14 discharges the die attach adhesive material via an elongate flow passage 16 disposed in fluid communication with the upper end of each syringe 12.

Die attach adhesive material of the kind noted, can have, for example, a viscosity on the order of 20,000 to 100,000 Centepoise. In addition, the die attach adhesive frequently includes a conductive material therein. A number of die attach materials may, for example, comprise a silver glass composition, silver polyimide, gold substitute in glass (sold under the trademark "AUSub"), or glass paste alone (where conductivity is not required). Thus, a mounting surface 17 receives, as shown in FIG. 1B, five individual dollops or droplets 18 thereon. When the flat bonding surface of a semiconductor chip is applied downwardly toward mounting surface 17, droplets 18 will individually spread as indicated by phantom lines 18' surrounding each of the droplets 18. Accordingly, as the drops are compressed by the bonding surface of a chip they spread and entrap air thereby forming voids within the bonding layer of adhesive. Such voids tend to affect the characteristics of the bond made with the semiconductor chip, such as thermal and electrical conductivity, die adhesion, and thermal expansion stress, for example.

As shown in FIG. 2 a significantly improved dispensing nozzle 19 has been provided as described further below for providing a deposit 21 of die attach adhesive material as shown in FIG. 3.

Nozzle 19 includes an elongate rigid body 22 including an elongate flow passage 23 extending therethrough for dispensing die attach adhesive material from the lower end thereof.

The upper end of body 22 carries a socket 24 communicating with the input end of flow passage 23 and adapted to be tightly coupled to means for supplying die attach adhesive material via the socket 24 and flow passage 23 onto a mounting surface. Thus the inside of socket 24 includes a conically tapered surface 24a of a type adapted to receive the discharge end of a syringe. The means for supplying die attach adhesive material can include various known dispensing pumps coupled to a supply line leading into flow passage 23.

The underside of nozzle 19 includes forming means in fluid communication with the discharge end (bottom end) of the flow passage 23. The forming means serves to form the deposit dispensed from opening 33 into the general shape of a starfish as shown in FIG. 3 as deposit 21. Thus the shape of the deposit generally includes a raised central portion disposed at the intersection of the radially inner ends of a plurality of arms 26 increasingly thickened progressively radially inwardly thereof. Arms 26 extend from the raised central portion of deposit 21 to cause deposit 21 to spread symmetrically and with uniform thickness across the mounting surface 27 when compressed by the planar bonding surface of a semiconductor chip applied thereto. Deposit 21 accordingly becomes substantially coextensive with the bonding surface of the chip when so spread therebeneath.

Therefore, as shown in FIG. 3, phantom lines 28 define the peripheral edge of a semiconductor chip applied to deposit 21, as well as defining the scope of spreading of deposit 21. Arms 26 of deposit 21 as deposited become progressively thicker radially inwardly thereof.

It has been observed that by providing a deposit of die attach adhesive material having a configuration wherein the central portion of the deposit represents the thickest part of the deposit and wherein the remainder of the deposit protrudes radially from the central portion at uniformly spaced angles, the application of a bonding surface of a semiconductor chip to the deposit will cause the die attach adhesive material to become uniformly distributed beneath the bonding surface of the chip in a manner so as to provide a uniform thickness coextensive with the bonding surface.

The forming means carried on the underside of nozzle 19 includes a planar surface 29 formed to extend transversely of the axis of flow passage 23. Surface 29 includes a pair of grooves 31, 32 formed in surface 29 and disposed to intersect. An opening 33 defining the lower end of flow passage 23 and disposed at the intersection of grooves 31, 32 serves to supply each of grooves 31, 32 with die attach adhesive material when a mounting surface is disposed beneath nozzle 19. Opening 33, thus, is in fluid communication with flow passage 23 to dispense die attach adhesive material into grooves 31, 32. Grooves 31, 32 are formed with sloping side walls to form the progressively thickened arms 26 of deposit 21. The depth of grooves 31, 32 progressively diminishes with remoteness from the intersection therebetween. As shown in FIG. 2B, surface 29 further includes a pair of protruding standoffs or spacers 34 carried to extend downwardly from surface 29 so as to provide means for uniformly spacing the planar surface 29 from a mounting surface when the stand-offs are disposed against the mounting surface as shown in FIG. 4B.

Nozzle 19 as shown above includes a branch flow passage 23a for forming a deposit to attach a grounding chip. However, another embodiment as shown in FIG. 10 has been shown for simply applying a starfish-shaped deposit for adhering a semiconductor chip. In using this embodiment it is assumed that a grounding chip is not required. The means for forming the deposit, such as 21 or 38, formed on the underside of nozzle 56 includes grooves and a flow passage thereto as described above, and identified in FIG. 10 by the same reference numbers used above but which are followed in FIG. 10 by a prime mark (').

In many instances it is desirable to apply a so-called grounding chip to the mounting surface in a manner whereby an electric connection is made to the conductive bonding layer interposed between the bonding surface of the semiconductor chip and the grounding chip.

As shown in FIG. 9, a conductive deposit 38 of die attach adhesive material to be spread beneath a semiconductor chip has been applied to a conductive mounting surface 36. A small deposit 37 of die attach adhesive material will therefore electrically connect to deposit 38 via the conductive mounting surface 36. Frequently surface 36 is silver plated in order to provide an appropriate conductive path to the conductive die attach adhesive material of deposit 38.

It has been observed that by forming a conductive causeway to extend between the deposit 21 of die attach adhesive material and a grounding chip disposed laterally thereof, a need for silver plating of the mounting surface can be avoided along with attendant significant costs.

Accordingly, when it is desired, as shown in FIG. 4A, to provide a grounding chip 40, in electrical circuit with the layer 39 of die attach adhesive material disposed beneath a semiconductor chip 41 and a mounting surface 42, an electrically conductive "causeway" 43 can be formed to interconnect chip 40 with chip 41 by means now to be described.

The forming means of nozzle 19 further includes a second flow passage 23a branching away from and in fluid communication with flow passage 23. Flow passage 23a terminates in an opening 44 in a plane adjacent the plane of the surface 29 to dispense a deposit 47 of the die attach adhesive material therethrough for use in attaching a grounding chip to the mounting surface at a locus disposed laterally of deposit 21.

The flow capacity of flow passage 23a is proportional to the flow capacity of passage 23 according to the ratio of the volume of the second deposit 47 to the volume of the first deposit 21 so as to permit a common pressure source such as pump 13 to simultaneously act upon and dispense the die attach material for forming both deposits.

In the particular embodiment shown in FIG. 2 an open ended groove 46 formed into a small planar surface 45 protruding slightly beneath the plane of surface 29 provides an elongate deposit 47 (FIG. 3) disposed to invade the periphery 28 of the bonding layer beneath a semiconductor chip. Deposit 47 therefore can carry a grounding chip in electrical connection to such bonding layer via the causeway defined by deposit 47.

Groove 46 includes the opening 44 for filling groove 46 with die attach adhesive material to form a conductive path on the mounting surface. The path extends from the periphery of the first named deposit as defined after a semiconductor chip has been pressed against the first named deposit to a grounding chip disposed in that path.

Another embodiment of the invention as shown in FIG. 8 shows a nozzle 51 which is adapted primarily to apply die attach material, such as deposit 37, for retaining a grounding chip to a conductive surface 36 while being spaced from deposit 38 on surface 36.

Thus, a grounding chip and semiconductor chip can be electrically connected via the conductive surface between the two deposits. Nozzle 51 further includes an axially disposed flow passage 53 and a branch 53a formed thereto provides the means described above for applying a deposit of die attach adhesive material generally in a starfish configuration and with an opening 54 for simultaneously discharging a small deposit 37 of die attach adhesive material laterally of the main deposit for bonding a semiconductor chip.

When carrying out the method of applying a die attach adhesive material to a mounting surface using a nozzle of the type described, the nozzle 19 as shown in FIG. 4B is moved downwardly to cause stand-offs 34 to engage with the mounting surface 27. In this closely spaced position die attach adhesive material is permitted to be forced out of the bottom opening 33 of flow passage 23. Likewise, at the same time a proportionate amount of die attach adhesive material is permitted to pass into groove 46.

It has been observed that the presence of stand-offs 34 permit a repeatable performance of the nozzle and at the same time permit the nozzle to be raised upwardly without creating any significant amount of "drawback" of the die attach adhesive material as can be caused in other systems by the surface tension of the material. Thus, as shown in FIG. 4C the nozzle 19 has been drawn upwardly away from mounting surface 27. Removal of nozzle 19 from surface 27 leaves the generally starfish shaped deposit 21 and a second elongate deposit 47. As shown in FIG. 4D the underside or bonding surface of a semiconductor chip 48 is moved downwardly against the raised central portion of deposit 21 for purposes of uniformly spreading deposit 21 between chip 41 and surface 27. In addition, a grounding chip 40 is disposed downwardly into the pliant material of deposit 47.

Accordingly, as semiconductor chip 41 urges the die attach adhesive material outwardly therefrom, preferably in a manner providing the fillet 39a (FIG. 4A) so as to indicate that the die attach material has been spread coextensively with the bonding surface of the chip 41, and for the following reasons. By spreading the die attach material in this manner, the adjacent end of deposit 47 will make contact with the die attach layer 39 (FIG. 4A) interposed between semiconductor chip 41 and mounting surface 27/42. Thereafter, the grounding chip can be urged into the outer end of the causeway formed by deposit 47 to make electrical connection between deposit 21 and grounding chip 40.

As shown in FIGS. 5, 6 and 7 a semiconductor package 49 includes a mounting surface for supporting a plurality of deposits of die attach adhesive material as described above. Thus, in FIG. 5 the mounting surface can be a nonconductive ceramic material or other nonconducting material suitable for the purpose, and the grounding chip will remain in circuit with the conductive bonding layer 39. In FIG. 6 a semiconductor chip 41 has been applied to the die attach material on the support surface and a grounding chip 40 has been attached to the outer end of the conductive causeway 43 interconnecting grounding chip 40 with the bonding layer 39 beneath chip 41.

Finally, in FIG. 7 by removing semiconductor chip 41 from bonding layer 39 the uniformity of the bonding layer becomes readily evident. Thus bonding layer 39 has a substantially uniform thickness and distribution throughout an area coextensive with distributed underside of the semiconductor chip attached thereto.

While configuration of deposit 21 has been referred to as having "the general shape of a starfish" it is recognized that a starfish usually has five arms. Nevertheless, it is submitted that the general shape of deposit 21 provides a resemblance to a starfish, and accordingly, the phrase as used herein is intended to include configurations which have those characteristics of a starfish including a raised central portion disposed at the intersection of a plurality of centrally thickened radially extending arms. Thus, a transverse section taken through any arm will provide more material in the middle of the arm than along the edges. This "central thickening" of the arm progressively increases from the outer end of the arm to the inner end whereby it is thickest adjacent the inner end.

The foregoing characteristics are believed to be applicable to a starfish and to the deposit shown in Applicant's disclosure.

Finally, there has been disclosed a method for bonding a plurality of semiconductor chips to a surface comprising the steps of simultaneously applying first and second deposits of die attach adhesive material in laterally spaced relation to each other upon a mounting surface in a manner wherein the first deposit has the general shape of a starfish. The shape is characterized by a raised central portion disposed at the intersection of a plurality of centrally thickened radially extending arms. The next step is to apply the bonding surface of a semiconductor chip against the first deposit to cause the first deposit to spread therebeneath across the bonding surface in a manner eliminating voids within the die attach adhesive material. The distributed volume of the deposit is proportional to the surface area of the bonding surface. When compressed by a planar bonding surface moving in a direction normal to the mounting surface and disposed in parallel relation thereto, the configuration of the first deposit as defined causes uniform and symmetrical spreading of the first deposit across the bonding surface to provide full coverage of the bonding surface with a uniformly thick layer of die attach. Finally, the second deposit is disposed at a locus laterally of the first deposit for securing a grounding chip thereto and for making an electrical connection with the first deposit in response to application of the semiconductor chip thereto.

From the foregoing it will be evident that there has been provided an improved method and device for bonding semiconductor chips to a mounting surface. Further the device as disclosed provides a deposit having a shape which provides a distributed volume of material proportional to the surface area to be bonded. Furthermore, by having angularly disposed arms, the shape of the deposit prevents voids from forming within the adhesive. Accordingly, the bonding surface of a semiconductor chip is fully and symmetrically covered. Forming the highest point of the deposit substantially centrally of the deposit forces out any air when compressed so as to prevent voids from forming. Finally, the nozzles as disclosed herein are arranged to provide a simultaneous deposit of both a die attach adhesive for bonding a semiconductor chip and a grounding chip in a manner having substantial repeatability.

What is claimed:

1. The combination comprising a mounting surface for bonding a semiconductor chip hereto, and a deposit of die attach adhesive material carried on said mounting surface for bonding the semiconductor chip thereto, said deposit being formed to spread across the bonding surface and provide full coverage of said bonding surface with a uniformly thick layer of adhesive free of voids in response to being compressed by a planar bonding surface of a chip moving normal to said mounting surface and disposed in parallel relation to the plane of the mounting surface, said deposit being of a substantially viscous material disposed and arranged in the general shape of a starfish having a plurality of radially extending arms, said shape being characterized by a raised central position disposed at the intersection of the radially inner ends of said plurality of arms, said arms being increasingly thickened progressively radially inwardly thereof to cause the deposit to spread symmetrically when compressed by a planar bonding surface of a die moving normally thereto while disposed in parallel relation to the plane of the mounting surface.

2. In a method for bonding semiconductor chips to a mounting surface comprising the steps of applying a first deposit of a die attach adhesive material to the mounting surface in a manner wherein said first deposit has the general shape of a starfish, said shape being characterized by a raised central portion disposed at the intersection of the radially inner ends of a plurality of centrally thickened arms, applying the bonding surface of a semiconductor chip against said deposit to cause said deposit to spread therebeneath across said bonding surface free of voids within the die attach adhesive, the volume of said deposit being proportional to the surface area of said bonding surface, and the configuration of said first deposit being defined to cause uniform and symmetrical spreading of said first deposit across said bonding surface to provide full coverage of said bonding surface with a uniformly thick layer of said adhesive.

3. In a method according to claim 2 in which said plurality of arms comprises four arms.

4. A nozzle for dispensing a deposit of die attach adhesive material onto a mounting surface for bonding a semiconductor chip to the surface, said nozzle comprising an elongate rigid body, an elongate flow passage formed therethrough for dispensing die attach adhesive material from an end of said flow passage a socket formed at one end of said body communicating with the input end of said flow passage and adapted to be tightly coupled to means for supplying die attach adhesive material via said socket and flow passage onto said mounting surface, forming means carried at the other end of said body in fluid communication with the other end of said flow passage, said forming means serving to form said adhesive material into a deposit having the general shape of a starfish characterized by a raised central portion disposed at the intersection of the radially inner ends of a plurality of arms increasingly thickened progressively radially inwardly thereof, said arms extending therefrom to cause said deposit to spread symmetrically and with uniform thickness across said mounting surface in response to application of the planar bonding surface of a semiconductor chip thereto, said deposit being substantially coextensive with said bonding surface of said chip when spread therebeneath.

5. In a method for bonding a plurality of semiconductor chips to a surface comprising the steps of simultaneously applying first and second deposits of die attach adhesive material in laterally spaced relation to each other upon a mounting surface in a manner wherein said first deposit has the general shape of a starfish, said shape being characterized by a raised central portion disposed at the intersection of a plurality of centrally thickened radially extending arms, applying the bonding surface of a chip against said first deposit to cause said first deposit to spread therebeneath across said bonding surface free of voids within the die attach adhesive, the volume of said deposit being proportional to the surface area of said bonding surface, the configuration of said first deposit being defined to cause uniform and symmetrical spreading of said first deposit across said bonding surface to provide full coverage of said bonding surface with a uniformly thick layer of said adhesive, and disposing said second deposit at a locus laterally of said first deposit for securing a grounding chip thereto.

6. A nozzle according to claim 4 in which said forming means comprises a planar surface formed at said other end of said body, a pair of grooves formed in said surface and disposed to intersect, and an opening disposed at the intersection of said grooves, said opening being in fluid communication with said flow passage to dispense die attach adhesive material into said grooves, said grooves being formed with sloping side walls to form said progressively thickened arms, and the depth and width of said grooves progressively diminishing with remoteness from said intersection.

7. A nozzle according to claim 6 in which said forming means further includes a second flow passage branching away from and in fluid communication with the first named said flow passage, said second flow passage terminating in an opening adjacent the plane of said planar surface and laterally adjacent the region occupied by said grooves to dispense a deposit of said die attach adhesive material therethrough for use in attaching a grounding chip to said mounting surface at a locus disposed laterally of the first named said deposit.

8. A nozzle according to claim 7 in which the flow capacity of said second flow passage is proportional to the flow capacity of the first named said flow passage according to the ratio of the volume of said second deposit to the volume of said first deposit so as to permit a common pressure source to simultaneously act upon and dispense both deposits.

9. A nozzle according to claim 6 comprising an open ended groove formed into said planar surface, said groove including said opening for filling said groove with die attach adhesive material to form a conductive path on said mounting surface, said path extending from the periphery of the first named said deposit as defined after a semiconductor chip has been pressed against the first named said deposit to a grounding chip disposed in said path.

10. A nozzle according to claim 6 comprising an open ended groove formed into the plane of said planar surface, said groove including said opening for filling said groove with die attach adhesive material to apply the contents of said open ended groove to a mounting surface when said planar surface is disposed in confronting, closely spaced relation to said mounting surface to form a conductive path on said mounting surface and extending between a grounding chip disposed in said path and the first named said deposit.

11. A nozzle according to claim 4 comprising a plurality of protruding stand-offs carried to extend downwardly from said planar surface of said forming means to uniformly space said planar surface from said mounting surface when said stand-offs are disposed against said mounting surface.

* * * * *